(12) United States Patent
Gugel et al.

(10) Patent No.: US 8,754,643 B2
(45) Date of Patent: Jun. 17, 2014

(54) COIL DESIGN FOR MINIATURIZED FLUXGATE SENSORS

(75) Inventors: Denis Gugel, Gerlingen (DE); Frank Schatz, Kornwestheim (DE)

(73) Assignee: Robert Bosch GmbH, Stuttgart (DE)

( * ) Notice: Subject to any disclaimer, the term of this patent is extended or adjusted under 35 U.S.C. 154(b) by 377 days.

(21) Appl. No.: 12/806,176

(22) Filed: Aug. 5, 2010

(65) Prior Publication Data

US 2011/0050221 A1 Mar. 3, 2011

(30) Foreign Application Priority Data

Aug. 25, 2009 (DE) .......................... 10 2009 028 854

(51) Int. Cl.
*G01R 33/04* (2006.01)
(52) U.S. Cl.
USPC ............................ 324/253; 324/240; 324/249
(58) Field of Classification Search
USPC .......................................... 324/240, 244–263
See application file for complete search history.

(56) References Cited

U.S. PATENT DOCUMENTS

| | | | | |
|---|---|---|---|---|
| 5,747,986 A | * | 5/1998 | Hristoforou | 324/207.13 |
| 6,429,651 B1 | * | 8/2002 | Choi et al. | 324/249 |
| 7,015,691 B2 | * | 3/2006 | Kang et al. | 324/253 |
| 7,737,687 B2 | * | 6/2010 | Na et al. | 324/253 |
| 2010/0301840 A1 | * | 12/2010 | Filatov | 324/207.11 |

FOREIGN PATENT DOCUMENTS

| | | |
|---|---|---|
| DE | 44 42 441 | 8/1995 |
| EP | 1 052 519 | 11/2000 |

* cited by examiner

*Primary Examiner* — Arleen M Vazquez
*Assistant Examiner* — Alesa Allgood
(74) *Attorney, Agent, or Firm* — Kenyon & Kenyon LLP

(57) ABSTRACT

A system for detecting a magnetic flux includes: a magnetic-flux-generating coil having a first and second excitation-track elements extending essentially parallel to a reference plane; a flux-conducting structure for guiding the produced magnetic flux; and a flux-detecting coil having a first detection-track element for measuring at least a portion of the produced magnetic flux, the first detection-track element extending in a first plane defined by the first and second excitation-track elements between the first and the second excitation-track elements. The projection of the excitation-track elements of the flux-generating coil onto a projection plane extending parallel to the reference plane essentially covers the projection of the flux-conducting structure onto the projection plane, at least in the region of the windings of the flux-generating coil.

8 Claims, 2 Drawing Sheets

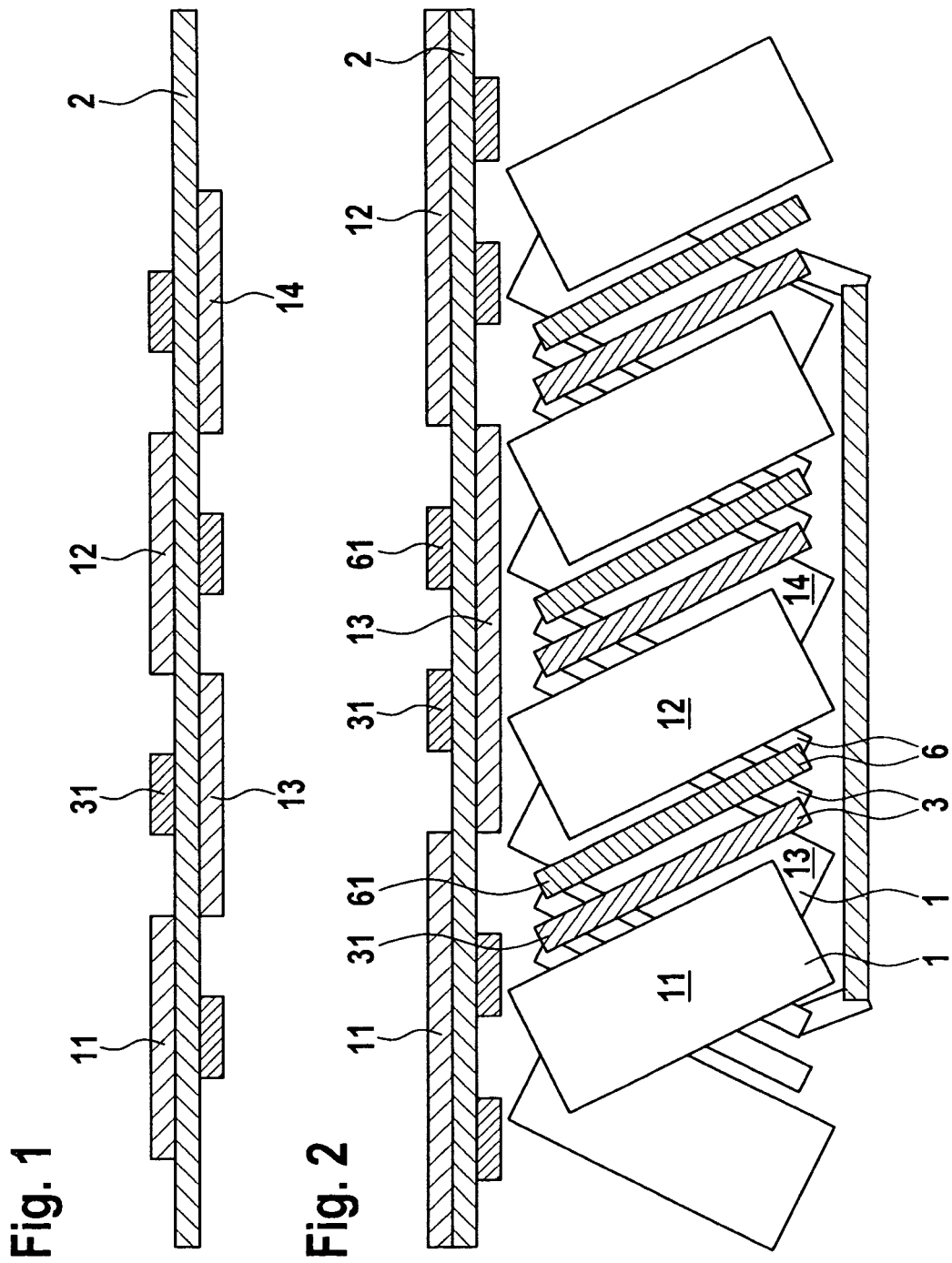

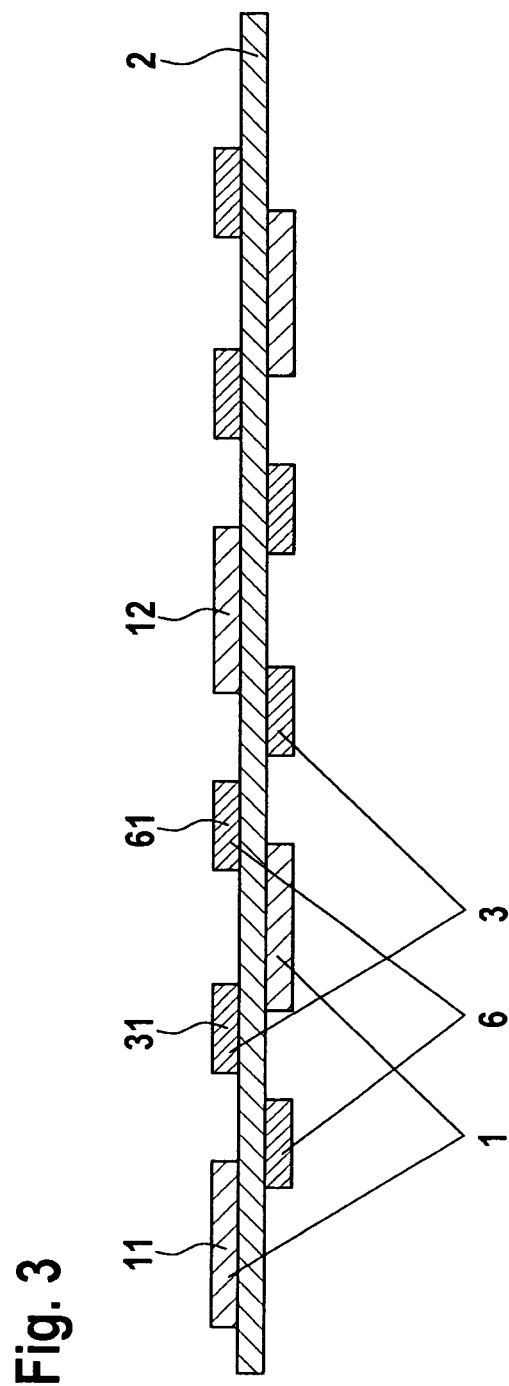

COIL DESIGN FOR MINIATURIZED FLUXGATE SENSORS

BACKGROUND OF THE INVENTION

1. Field of the Invention

The present invention relates to a system for detecting a magnetic flux.

2. Description of the Related Art

Such systems are generally known, e.g., from the published German patent document DE 44 42 441 A1 and published European patent document EP 1 052 519 B1, systems of the so-called fluxgate type are known, which have a semiconductor substrate, an excitation element, two detection coils, and a magnetic core. The excitation element includes a coil, which is operated using an alternating current featuring an excitation frequency. The magnetic flux density B in a ferromagnetic material is defined by the strength of the surrounding magnetic field H. A magnetic flux in accordance with the magnetic hysteresis curve (B-H-curve) having the same frequency as the excitation frequency of the alternating current is generated in the magnetic core. The magnetic flux in the magnetic core is proportional to the product from magnetic permeability $\mu$ and field strength H of the magnetic field. The permeability is very low in the saturation range, whereas it is very high in the zero crossing of the hysteresis curve. Due to the non-linearity of the permeability, an external magnetic field causes a distortion of the magnetic flux, which is detectable with the aid of the detection coil. In the absence of an external magnetic field, the induced currents in the detection coils are equal to zero. However, if an external magnetic field is present, then the induction currents have different harmonics of the excitation frequency. The sum of the induction currents is not equal to zero and thus a measure for the strength of the external magnetic field.

In the published German patent document DE 44 42 441 A1, a detection system made up of a flux-generating coil, a flux-conducting structure, and a flux-detecting component is described. The flux-generating coil, the flux-conducting structure as well as the flux-detecting component are realized in a plurality of layers on a substrate, the flux-generating coil and the flux-detecting component being spatially separated from each other, and no system such as it is provided in the case of windings that are interlaced with one another (corresponding to two coil systems wound with one another) being present.

BRIEF SUMMARY OF THE INVENTION

In contrast, the detection system according to the present invention and the method for producing a system according to the present invention have the advantage over the related art that in order to magnetize a flux-conducting structure (hereinafter also referred to as magnetic core), the most homogeneous magnetic field possible is also produced between adjacent windings of a flux-generating coil (hereinafter also referred to as excitation coil), at least one winding of a flux-detecting coil (hereinafter also referred to as pickup coil) being disposed between adjacent windings of the flux-generating coil.

According to the present invention, the detection system is provided in the form of a MEMS (micro-electromechanical system), i.e., as a microsystem, situated in particular on a semiconductor substrate (e.g., of silicon material) or a chip. In systems having a micro-electromechanical design, the number of windings for the excitation coil and the pickup coil is typically limited. Furthermore, the strength of the produced magnetic field both above (or below) a layer (or a track element) traversed by the current, and also to its sides, drops relatively quickly, so that for one, both the flux-generating coil and the flux-detecting coil are implemented in one layer and for another, even a relatively small gap between two adjacent windings of the excitation coil causes the produced magnetic field to be relatively weak in the region between these two adjacent windings. Because of the technology utilized (specified minimum structure width as well as one-layer excitation and pickup coils) the maximally possible total number of windings is specified. The detection system is able to be optimized according to the present invention by suitably distributing the windings to the excitation region and the pickup region, and by selecting suitable dimensions of the circuit traces.

The present invention has the advantage that the highest possible homogeneity of the magnetic field is able to be combined with the highest possible detection sensitivity of the remagnetization in the magnetic core. By appropriate placement and width of the circuit traces of the excitation coil, a first example embodiment of the present invention advantageously makes it possible to generate an extremely homogeneous magnetic field in the flux-conducting structure in order to magnetize the magnetic core, which is preferably developed as magnetic thin film, at least one winding of the flux-detecting coil being disposed between adjacent windings of the flux-generating coil.

As an alternative, a second example embodiment of the present invention advantageously even makes it possible to dispose two flux-detecting coil windings between two adjacent windings of the flux-generating coil. In an advantageous manner, a considerable increase in the detection sensitivity of the remagnetization in the magnetic core (preferably likewise developed as magnetic thin film) is able to be achieved, while the homogeneity of the produced magnetic field is reduced only to a relatively insignificant degree.

According to one further development of the first example embodiment, the system includes an additional flux-detecting coil. The excitation-track elements and the detection-track elements are placed in such a way, in particular, that two detection-track elements extend between two adjacent excitation-track elements running in the same plane. In an advantageous manner, the number of windings of the flux-detecting coils is able to be increased when parallel windings are implemented, thereby making it possible to achieve the highest possible detection sensitivity of the remagnetization in the magnetic core with this increased number of windings in the flux-detecting coil. A further advantage of the further development is that the most homogeneous magnetic field possible is produced in the system according to the present invention. This further development combines the highest-possible homogeneity of the generated magnetic field and the highest-possible detection sensitivity of the remagnetization in the magnetic core. Another advantage of the further development is that broader excitation-track elements exhibit lower electric resistance. Because of this, either lower power output is achieved at the same current intensity, or a higher current intensity is used at the same power output.

According to another further development, the excitation-track elements extend in two parallel planes. The parallel placement of the excitation-track elements advantageously makes it possible to improve the homogeneity of the generated magnetic field.

According to another further development, the flux-detecting coil is connected in series with the additional flux-detecting coil. The series connection of the two flux-detecting coils is advantageously able to be achieved in an uncomplicated manner by connecting the output of the flux-detecting coil to the input of the additional flux-detecting coil directly on the chip.

According to another further development, the flux-detecting coil is connected to the further flux-detecting coil via a connection that runs outside of the region in which the windings of the flux-generating coil are disposed, so that the magnetic flux is detectable in a relatively simple manner.

According to another further development, the flux-conducting structure is developed as magnetic thin film, the magnetic thin film essentially running parallel to the plane. The magnetic thin film is able to be applied on the substrate in a relatively uncomplicated manner with the aid of the employed micro-system technology.

Another object of the present invention is to provide a method for producing a system for detecting a magnetic flux, the system being produced as microsystem and being realized on a semiconductor substrate. The production as micro system on a semiconductor substrate (e.g., made from silicon material) also makes it possible to combine the advantages of the present invention (highest possible homogeneity of the generated magnetic field and highest-possible detection sensitivity of the remagnetization in the magnetic core) with the advantages of MEMS technology (relatively cost-effective production, low space requirement).

According to one further development of the method according to the present invention, the flux-conducting structure is applied on the semiconductor substrate in the form of a magnetic thin film. The advantages of the present invention (highest possible homogeneity of the produced magnetic field and highest possible detection sensitivity of the remagnetization in the magnetic core) are able to be combined with the relatively simple application of a magnetic thin film.

BRIEF DESCRIPTION OF THE DRAWINGS

FIG. 1 shows a schematic illustration of a longitudinal section in a side view, of a detection system according to a first example embodiment of the present invention.

FIG. 2 shows schematic representations of a longitudinal section in a side view and a top view of a detection system according to an example development of the first example embodiment of the present invention.

FIG. 3 shows a schematic illustration of a longitudinal section in a side view of a detection system according to a second example embodiment of the present invention.

DETAILED DESCRIPTION OF THE INVENTION

In the various figures, identical parts are always denoted by the same reference symbols and are therefore usually labeled or mentioned only once.

The following description and the referenced figures relate to exemplary embodiments of a detection system according to the present invention. The detection system has a flux-generating coil 1, a flux-conducting structure 2, and a flux-detecting coil 3. Coils 1, 3 are implemented as three-dimensional coils. The detection system is produced in MEMS (micro-electro-mechanical system) technology. Coils 1, 3, and flux-conducting structure 2 are produced on a substrate, flux-conducting structure 2 essentially extending parallel to the main-extension plane of the substrate. For the sake of simplicity, the substrate is not shown in the figures. The production of coils 1, 3 is performed, for example, by patterning a first conductive plane, especially a first metallization plane, for the particular parts of the coil windings that are disposed underneath flux-conducting structure 2, and by patterning a second conductive plane, in particular a second metallization plane, for the particular parts of the coil windings that are disposed above flux-conducting structure 2. The coil planes and flux-conducting structure 2, which is implemented as magnetic thin film, are electrically insulated from each other by a separate insulation layer. An electrical contact between the coil planes or the conductive planes is present only in the region of contact points that extend essentially perpendicular to the main extension plane of flux-conducting structure 2 or the substrate, in order to close the coil windings around flux-conducting structure 2.

FIG. 1 shows a schematic representation of a longitudinal section of a detection system according to a first example embodiment of the present invention, in a side view, the longitudinal section extending along flux-conducting structure 2 or along the main-extension direction of flux-conducting structure 2. Flux-generating coil 1 has excitation-track elements 11, 12, 13, 14. Flux-detecting coil 3 has a first detection-track element 31. A first and second excitation-track element 11, 12 extend in a first plane, which runs above flux-conducting structure 2 in FIG. 1. A third and fourth excitation-track element 13, 14 extend in a second plane, which runs parallel to the first plane and extends below flux-conducting structure 2 in FIG. 1. First detection element 31 extends in the first plane between first and second excitation-track elements 11, 12. Flux-conducting structure 2 extends between the first and second planes. The parallel projection of excitation-track elements 11, 12, 13, 14 onto a plane (projection plane) that is situated parallel to the first and second planes, essentially covers the parallel projection of flux-conducting structure 2 onto this plane completely, at least in the region of the windings of flux-generating coil 1. In the first specific embodiment, this coverage realizes the highest possible homogeneity of the generated magnetic field. In addition, only one winding of flux-detecting coil 3 is situated between two adjacent windings of flux-generating coil 1, so that excitation-track elements 11, 12, 13, 14 are able to be realized at a relatively narrow size. The width of excitation-track elements 11, 12, 13, 14 preferably results from the width of first detection-track element 31, plus twice the distance between first excitation-track element 11 and first detection-track element 31. Because of relatively narrow excitation-track elements 11, 12, 13, 14, a relatively high number of windings of flux-generating coil 1 is able to be realized.

FIG. 2 shows in the upper part of the figure a schematic illustration of a longitudinal section in a side view, and in the lower part of the figure, a plan view of a detection system according to a exemplary development of the first example embodiment of the present invention; here, too, the complete coverage of flux-conducting structure 2 by flux-generating coil 1 is realized. The upper part of FIG. 2 corresponds to a longitudinal section along a cutting line that is situated approximately in the center of flux-conducting structure 2, in its main-extension direction, and in the center of the lower illustration according to FIG. 2. The system includes a further flux-detecting coil 6 having a second detection-track element 61, first detection-track element 31 and second detection-track element 61 extending between first excitation-track element 11 and second excitation-track element 12. Furthermore, flux-detecting coil 3 is connected in series with further flux-detecting coil 6, the output of flux-detecting coil 3 being connected to the input of further flux-detecting coil 6. Furthermore, flux-detecting coil 3 is connected to further flux-detecting coil 6 via a connection that extends outside of the region in which the windings of flux-generating coil 1 are disposed. In this example development, the greatest possible homogeneity of the produced magnetic field is realized by the coverage of flux-conducting structure 2 according to the present invention. The width of excitation-track elements 11, 12, 13, 14, given the same width of detection-track elements 31, 61, preferably results from twice the width of detection-track elements 31, 61, plus triple the distance between first excitation-track element 11 and first detection-track element 31, the distance between first excitation-track element 11 and first detection-track element 31 corresponding to the distance between detection-track elements 31, 61, or the distance between second detection-track element 61 and second excitation-track element 12. However, in addition to the greatest possible homogeneity, the greatest possible detection sensitivity of the remagnetization in the magnetic core is realized as well, since two windings of flux-detecting coils 3, 6 are disposed between two adjacent windings of flux-generating coil 1. In addition, a series connection is realized by a relatively uncomplicated connection of the output of flux-detecting coil 3 to the input of further flux-detecting coil 6, directly on the chip. This makes it possible to increase the detection sensitivity in a relatively simple manner due to a higher number of windings of flux-detecting coils 3, 6.

FIG. 3 shows a schematic illustration of a longitudinal section along flux-conducting structure 2 or along the main-extension direction of flux-conducting structure 2, in a side view of a detection system according to a second example embodiment of the present invention. First detection-track element 31 and second detection-track element 61 extend between first excitation-track element 11 and second excitation-track element 12. In this second specific embodiment, two windings of flux-detecting coils 3, 6 are disposed between two adjacent windings of flux-generating coil 1. Full coverage of flux-conducting structure 2 is dispensed with, and a relatively slight reduction in the homogeneity of the produced magnetic field in the region of flux-conducting structure 2 is tolerated. This makes it possible to realize excitation-track elements 11, 12, 13, 14 in relatively narrow size, so that the system features the highest possible number of windings of flux-detecting coils 3, 6 in order to realize the highest-possible detection sensitivity of the remagnetization in the magnetic core.

What is claimed is:

1. A system for detecting a magnetic flux, comprising: a flux-generating coil for producing a magnetic flux, the flux-generating coil having a plurality of windings and at least one first and one second excitation-track elements in the region of the windings, the excitation-track elements extending in a first plane; a flux-conducting structure for guiding the produced magnetic flux, wherein the first plane runs above the flux-conducting structure and parallel to a main extension direction; and a first flux-detecting coil having a first detection-track element for measuring at least one portion of the produced magnetic flux, wherein the first detection-track element extends between the first and second excitation-track elements in the first plane essentially completely cover of the flux-conducting structure, wherein at least one of the first excitation-track element and the second excitation-track element is in contact with the flux-conducting structure.

2. The system as recited in claim 1, further comprising:
a second flux-detecting coil having a second detection-track element;
wherein the first excitation-track element and the second excitation-track element extend parallel to each other in the first plane along a main-extension direction of the first and second excitation-track elements, and wherein the first excitation-track element and the second excitation-track element are set apart in the first plane in a direction perpendicular to the main-extension direction, and wherein the first detection-track element and the second detection-track element extend in the first plane, and wherein the first detection-track element and the second detection-track element extend between the first excitation-track element and the second excitation-track element.

3. The system as recited in claim 2, wherein the flux-generating coil has a third excitation-track element and a fourth excitation-track element extending in a second plane parallel to the first plane, and wherein the flux-conducting structure extends between the first plane and the second plane.

4. The system as recited in claim 2, wherein the first flux-detecting coil is connected in series with the second flux-detecting coil such that the output of the first flux-detecting coil is connected to the input of second flux-detecting coil.

5. The system as recited in claim 4, wherein the first flux-detecting coil is connected to the second flux-detecting coil by a connection extending outside of the region in which the windings of the flux-generating coil are situated, such that the induction currents in the first and second flux-detecting coils have the same arrangement with respect to a main-extension direction of the system.

6. The system as recited in claim 4, wherein the flux-conducting structure is configured as a magnetic thin film extending essentially parallel to the reference plane.

7. The system as recited in claim 6, further comprising a semiconductor substrate, wherein the system is a microsystem.

8. The system as recited in claim 7, wherein the flux-conducting structure in the form of a magnetic thin film is applied on the semiconductor substrate.

* * * * *